United States Patent
Su et al.

(10) Patent No.: US 10,768,527 B2
(45) Date of Patent: Sep. 8, 2020

(54) RESIST SOLVENTS FOR PHOTOLITHOGRAPHY APPLICATIONS

(71) Applicant: Taiwan Semiconductor Manufacturing Co., Ltd., Hsin-Chu (TW)

(72) Inventors: Yu-Chung Su, Hsinchu (TW); Kuan-Hsin Lo, Nantou County (TW); Yahru Cheng, Taipei (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 116 days.

(21) Appl. No.: 16/102,429

(22) Filed: Aug. 13, 2018

(65) Prior Publication Data
US 2020/0050110 A1    Feb. 13, 2020

(51) Int. Cl.
*G03F 7/16* (2006.01)
*G03F 7/20* (2006.01)
*G03F 7/09* (2006.01)
*H01L 21/027* (2006.01)

(52) U.S. Cl.
CPC .............. *G03F 7/162* (2013.01); *G03F 7/091* (2013.01); *G03F 7/70033* (2013.01); *H01L 21/0276* (2013.01)

(58) Field of Classification Search
CPC ...... G03F 7/162; G03F 7/091; G03F 7/70033; G03F 7/0392; G03F 7/0048; H01L 21/0276
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 9,958,779 B2 * | 5/2018 | Lai .......................... | G03F 7/091 |
| 2007/0077352 A1 * | 4/2007 | Koo ........................ | G03F 7/168 |
| | | | 427/240 |
| 2013/0233826 A1 * | 9/2013 | Seko ........................ | G03F 7/11 |
| | | | 216/47 |

(Continued)

*Primary Examiner* — Stephen W Smoot
*Assistant Examiner* — Vicki B. Booker
(74) *Attorney, Agent, or Firm* — Haynes and Boone, LLP

(57) ABSTRACT

A method includes providing a photoresist solution that includes a first solvent having a first volume and a second solvent having a second volume, where the first solvent is different from the second solvent and where the first volume is less than the second volume; dispersing the photoresist solution over a substrate to form a film, where the dispersing evaporates a portion of the first solvent and a portion of the second solvent such that a remaining portion of the first solvent is greater than a remaining portion of the second solvent; baking the film; after baking the film, exposing the film to form an exposed film; and developing the exposed film.

20 Claims, 7 Drawing Sheets

(56) References Cited

U.S. PATENT DOCUMENTS

2014/0210057 A1* 7/2014 Lin ...................... G03F 7/0387
                                                        257/643
2016/0131976 A1* 5/2016 Tsuchimura .......... G03F 7/0045
                                                          430/5

* cited by examiner

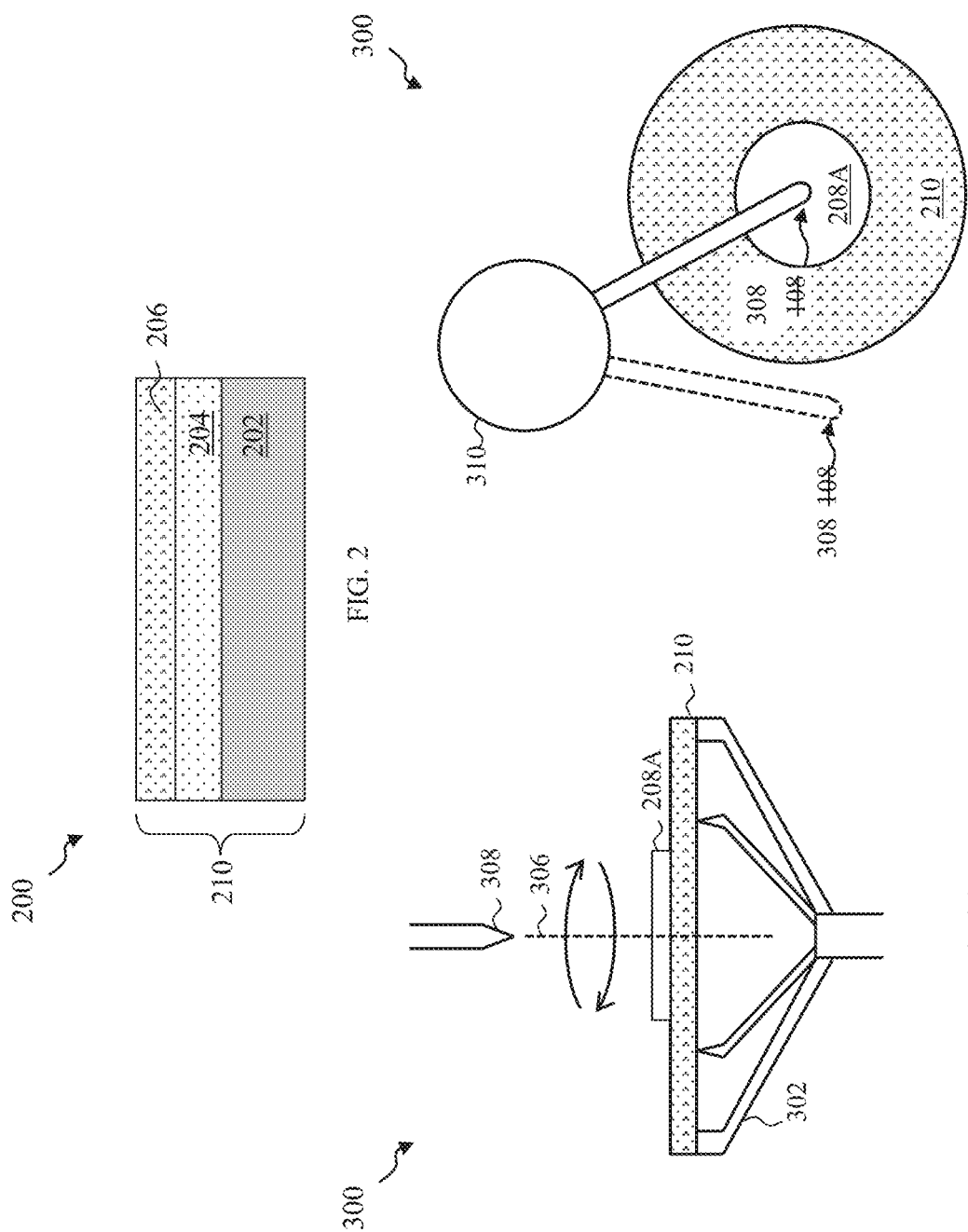

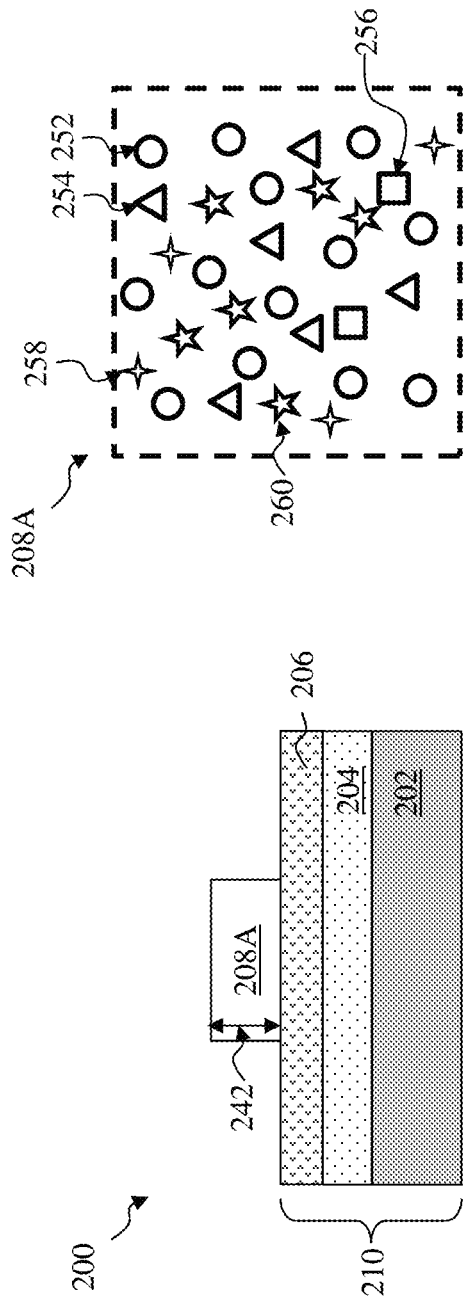

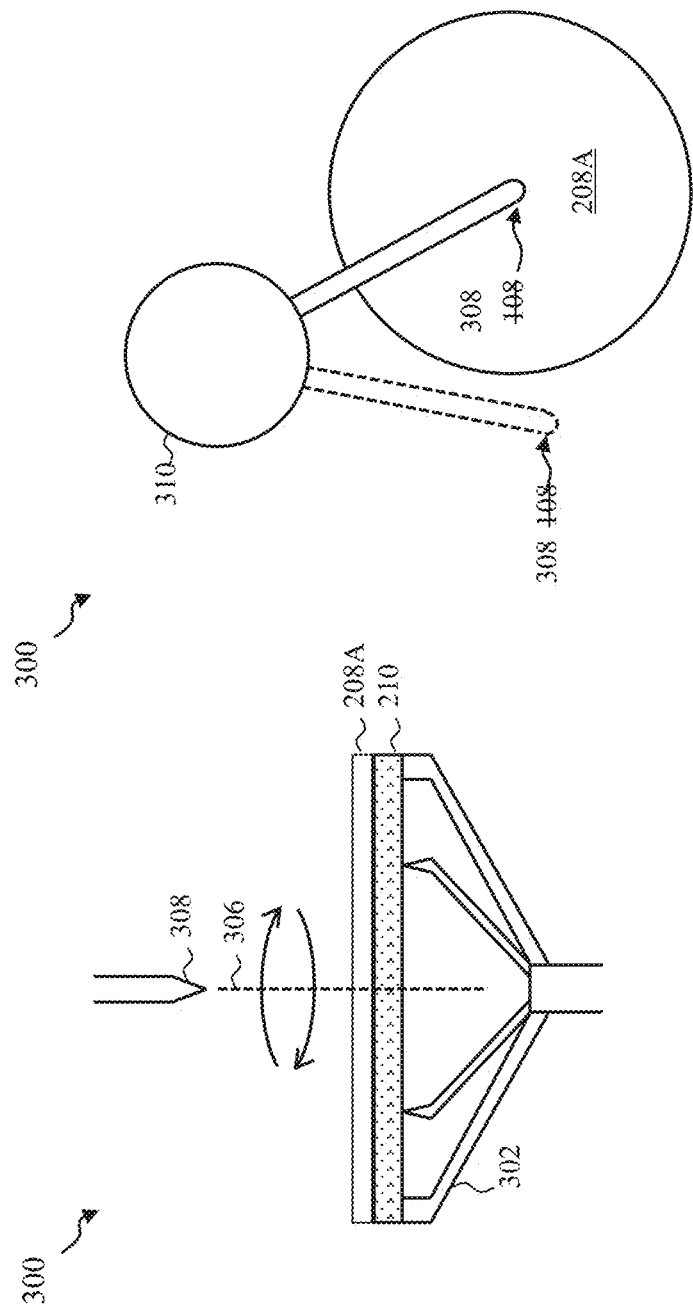

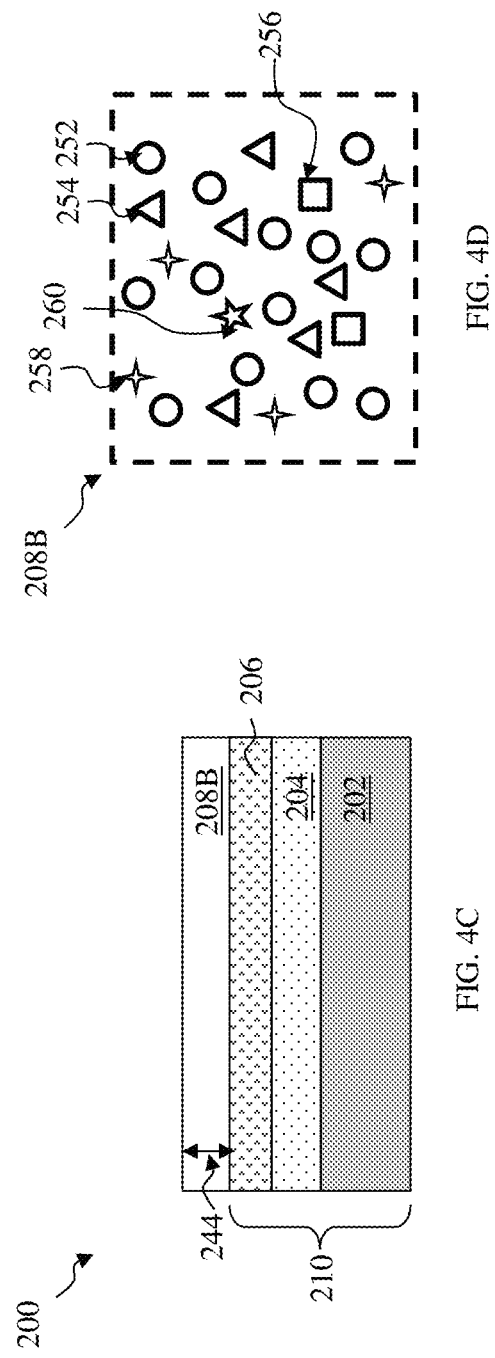

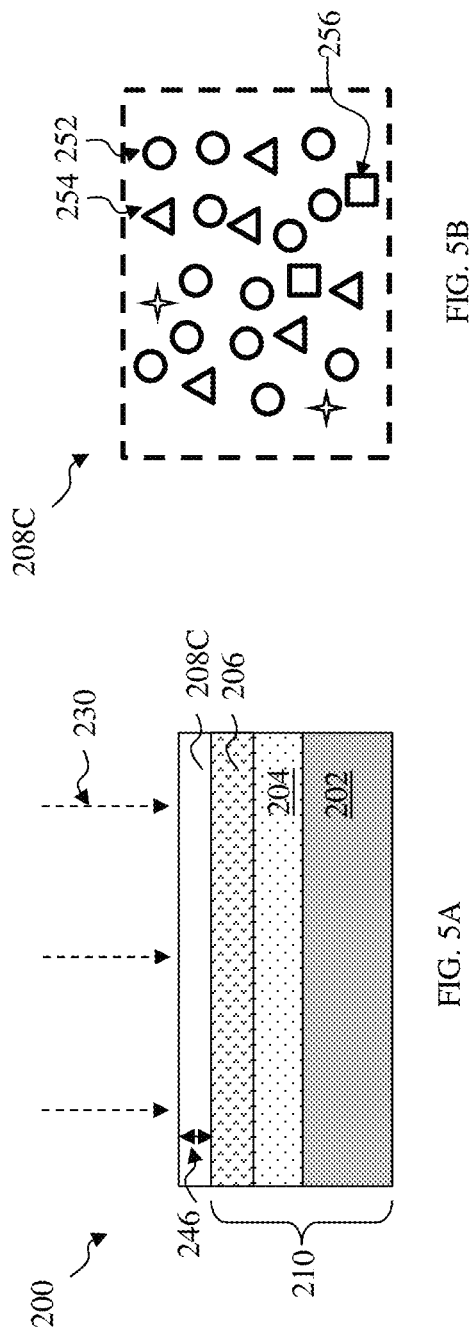

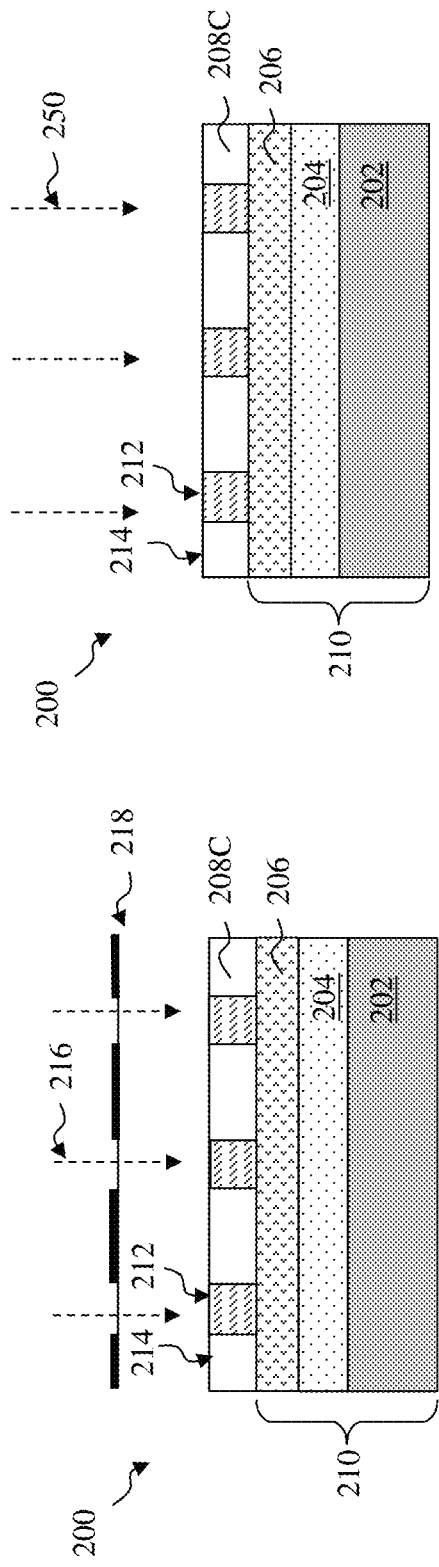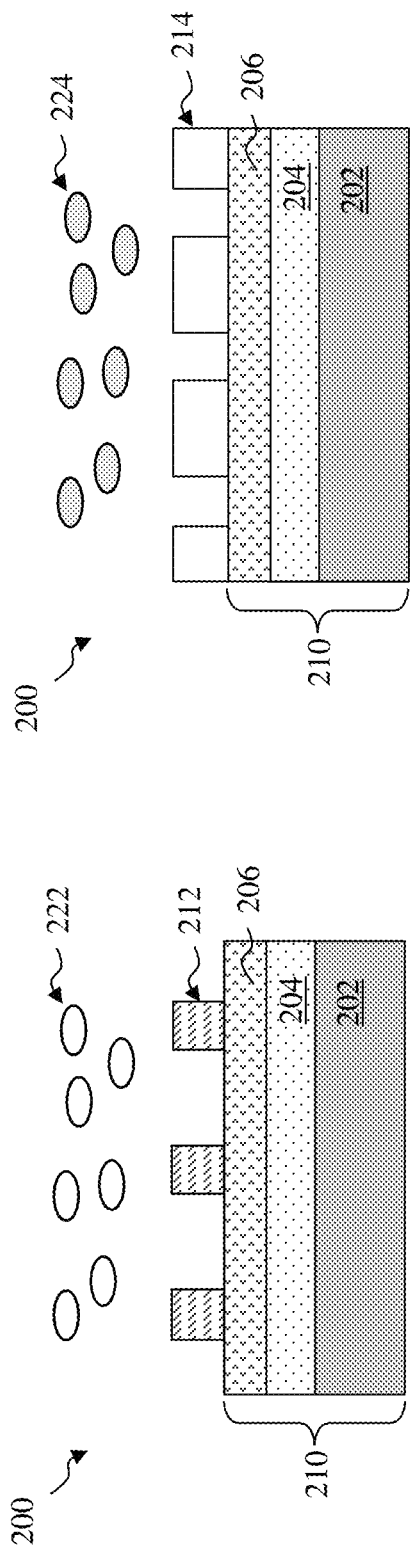

RESIST SOLVENTS FOR PHOTOLITHOGRAPHY APPLICATIONS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

Lithography processes, for example, are extensively utilized in integrated circuit (IC) manufacturing, where various resist patterns are transferred to a workpiece to form an IC device. In many instances, quality of a resist layer (and thus, the final pattern) formed over the workpiece directly impacts quality of the resulting IC device. Quality of the resist layer may be affected by dispersion of various components of a resist solution from which the resist pattern is obtained. Although existing lithography techniques have been generally adequate, they have not been entirely satisfactory in all aspects. For example, non-uniform dispersion of functional units facilitating the exposure of the resist layer may lead to adverse effects with respect to resolution, roughness (for example, line edge roughness (LER) and/or line width roughness (LWR)), and/or contrast of the final pattern.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 2, 3A, 4A, 5A, 6, 7, 8A, and 8B are cross-sectional views of a semiconductor device at intermediate steps of the method of FIG. 1 according to various aspects of the present disclosure.

FIGS. 3B, 4B, and 5B are schematic representations of a composition of a portion of the semiconductor device illustrated in FIGS. 3A, 4A, and 5A, respectively, according to various aspects of the present disclosure.

FIGS. 3C and 4C are cross-sectional views of an apparatus for forming a portion of a semiconductor device according to various aspects of the present disclosure.

FIGS. 3D and 4D are top views of the apparatus of FIGS. 3C and 4C, respectively, according to various aspects of the present disclosure.

DETAILED DESCRIPTION

Figure 1:
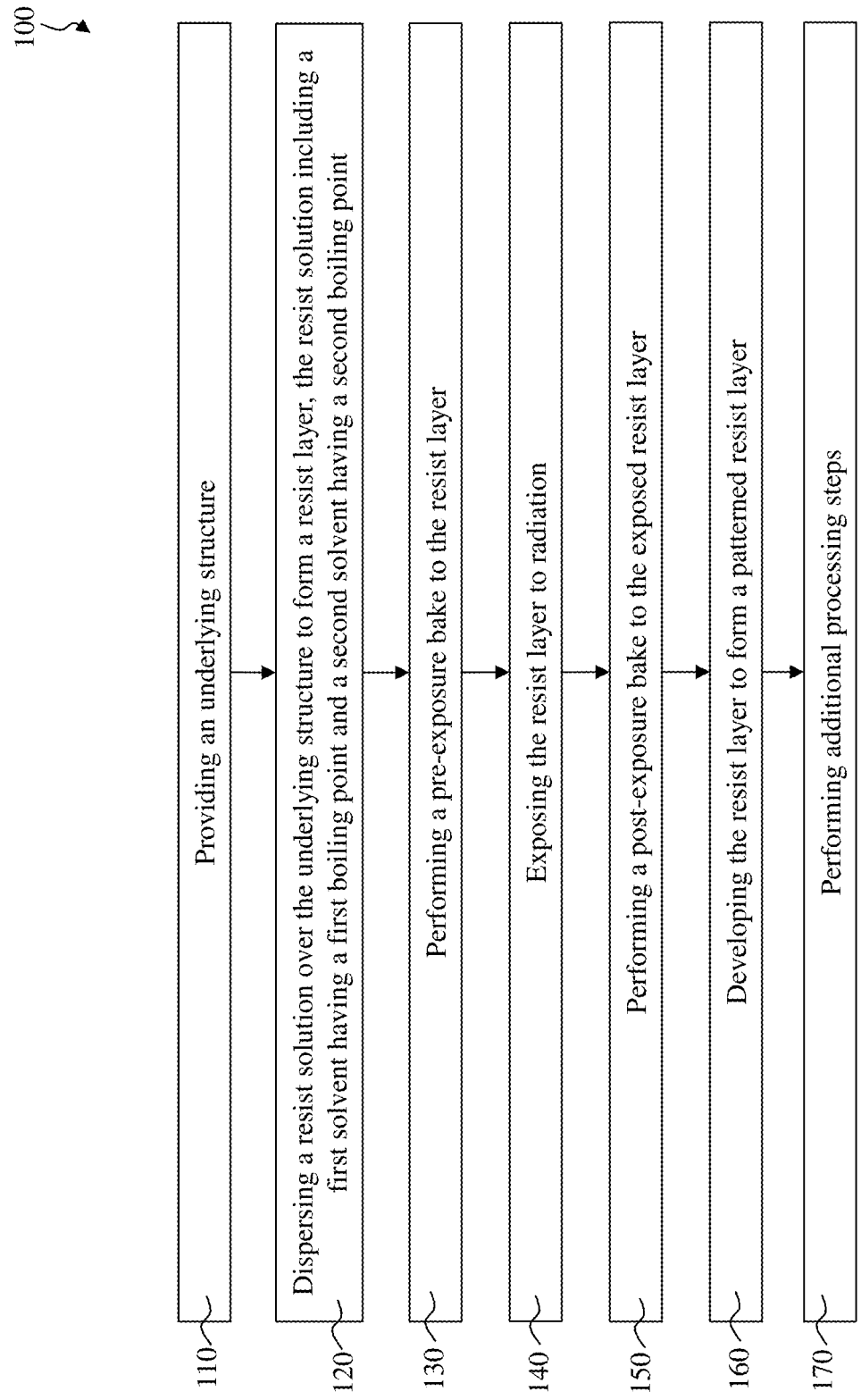
FIG. 1 is a flowchart of a method for fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

A lithography process involves forming a resist layer over a workpiece and exposing the resist layer to patterned radiation. After being exposed to the patterned radiation, the resist layer is developed in a developer (i.e., a chemical solution). The developer removes portions of the resist layer (for example, exposed portions of positive tone resist layers or unexposed portions of negative tone resist layers), thereby forming a patterned resist layer. The patterned resist layer is then used as a masking element during a subsequent process, such as an etching process or an implantation process, to transfer a pattern in the patterned resist layer to the workpiece. Advanced lithography materials, such as chemically amplified resist (CAR) materials, have been introduced to improve sensitivity of the resist layer to the radiation, thereby maximizing utilization of the radiation. For example, CAR materials can generate multiple chemical reactions upon exposure to radiation, thereby chemically amplifying a response to the radiation, which lowers exposure doses required for defining the pattern in the resist layer. Many CAR materials include a polymer that is resistant to an IC process (such as an etching process), an acid generating component (such as a photoacid generator (PAG)), and/or other components configured to facilitate the exposure and/or development processes (such as a quencher). The CAR materials may be applied over the workpiece by a coating process, such as spin-coating. As such, a solvent component may be included in the CAR materials for facilitating the application of the polymer, the PAG, and/or other components over the workpiece during the spin-coating process.

Extreme ultraviolet (EUV) lithography, which utilizes radiation having wavelengths in the EUV range, provides promise for meeting finer lithography resolution limits, particularly for sub-10 nm IC manufacturing. However, higher sensitivity CAR materials are often required at EUV wavelengths because exposure doses required for meeting resolution, contrast, and/or roughness requirements, along with throughput requirements (such as wafers per hour (WPH)), are limited by conventional EUV sources. It has been observed that a volume of resist material absorbs fewer EUV photons than deep ultraviolet (DUV) photons (such as ArF photons) when exposed to the same exposure dose (for example, about 10 $mJ/cm^2$), which often means that less acid will be generated by CAR materials for catalyzing reactions. To address this phenomenon, which is generally referred to as shot noise, one method is to increase amount of PAGs included in the resist material, thereby increasing the extent and efficiency of acid generation initiated by the exposure process. In one such example, an EUV resist material may include three to four times the amount of PAG in comparison to a DUV resist material. However, an increased amount of PAG may lead to challenges in implementing the lithography process. For example, an increased amount of PAG, which may also be accompanied by an increased amount of other components such as quencher, could lead to non-uniform distribution of the CAR materials during the spin-coating process. At least two reasons may be responsible. On one hand, the PAG tend to aggregate due to more favorable interaction with itself than with other components, such as the solvent and/or the polymer. When the amount of PAG increases, this effect is intensified. On the other hand, the solvent included in the CAR materials, while having good solubility toward components of the CAR materials at first, tends to evaporate during the spin-coating process, leading to further aggregation of the PAG, the polymer, and/or other components.

Accordingly, for these and other reasons, improvements are desired with respect to controlling the distribution of a resist material, such as a CAR material, during a spin-coating process. As demonstrated by embodiments below, controlling the distribution of the resist material may be achieved by incorporating solvents having different boiling points (or vapor pressure).

FIG. 1 illustrates a flowchart of a method 100 for processing a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to cross-sectional views of the workpiece 200 as shown in FIGS. 2, 3A, 4A, 5A, 6, 7, 8A, and 8B, while schematic representations of compositions of a portion of the workpiece 200 are shown in FIGS. 3B, 4B, and 5B. An apparatus for forming a portion of the workpice 200 is illustrated in FIGS. 3A-3B and 4A-4B. For clarity and ease of explanation, some elements of the figures have been simplified.

Referring to FIGS. 1 and 2, the method 100 provides (or is provided with) an underlying structure 210 at operation 110. The underlying structure 210 may be a single-layer material having a uniform composition or a multi-layer structure having similar or different compositions suitable for IC device manufacturing. In the depicted embodiment, the underlying structure 210 includes multiple material layers, each of which will be discussed in detail below.

The underlying structure 210 may include a substrate 202. The substrate 202 may comprise an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or other suitable materials. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

The substrate 202 may include various circuit features formed thereon or therein including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof. In some embodiments where the substrate 202 includes FETs, such that various doped regions, such as source/drain regions, are formed in or on the substrate 202. The doped regions may be doped with p-type dopants, such as boron or $BF_2$, and/or n-type dopants, such as phosphorus or arsenic, depending on various design requirements. The doped regions may be planar or non-planar (e.g., in a fin-like FET device) and may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIG. 2, the underlying structure 210 may include a bottom layer 204 (or a first layer) formed over the substrate 202. In many embodiments, the bottom layer 204 is an anti-reflective coating (ARC) whose composition is chosen to minimize reflectivity of radiation implemented during exposure of a subsequently-formed resist layer (e.g., resist layer 208). The bottom layer 204 may be formed by spin-coating an ARC material (e.g., an amorphous carbon material) onto a top surface of the substrate 202 (or a top surface of the topmost material layer of a multi-layered substrate) and optionally baked for curing.

The underlying structure 210 may additionally include a middle layer 206 (or a second layer) formed over the bottom layer 204. The middle layer 206 may be a single-layer structure or may include multiple layers each having a different composition. In many embodiments, the middle layer 206 has a composition that provides anti-reflective properties, hard mask properties, and/or barrier properties for a subsequently implemented lithography process. The middle layer 206 may include a silicon-rich polymer and/or other suitable materials. Alternatively or additionally, the middle layer 206 may include a dielectric material, such as silicon oxide, silicon nitride, silicon carbide, silicon oxynitride, and/or other suitable materials. The middle layer 206 may be formed by a spin-coating process similar to that described with respect to the bottom layer 204 and/or a deposition process, such as chemical vapor deposition (CVD), atomic layer deposition (ALD), physical vapor deposition (PVD), spin-coating, other suitable processes, or combinations thereof. In some embodiments, the underlying structure 210 includes additional material layers formed over the middle layer 206. In some embodiments, the bottom layer 204 and/or the middle layer 206 are omitted from the underlying structure 210.

Referring to FIGS. 1 and 3A-4D, the method 100 at operation 120 disperses a resist (e.g., photoresist) solution 208A over a top surface of the underlying structure 210 (for example, over a top surface of the middle layer 206) to form a resist (e.g., photoresist) layer 208B. Referring to FIGS. 3A-3D, the method 100 supplies or dispenses the resist solution 208A to the top surface of the underlying structure 210 using a spin coating system 300. Subsequently, referring to FIGS. 4A-4D, the method 100 disperses the resist solution 208A across the top surface of the underlying structure 210 to form the resist layer 208B using the spin coating system 300. The resist layer 208B may include a single layer of material or multiple layers of different materials. In the depicted embodiment, the resist layer 208B is a photosensitive layer operable to be further treated (e.g., in a baking process) and then patterned by an exposure process, which initiates a series of photochemical reactions in the resist layer 208B. The resist layer 208B may include any suitable photosensitive resist material, and in many embodiments, the resist layer 208B includes a resist material sensitive to radiation (e.g., ultraviolet (UV) light, deep ultraviolet (DUV) radiation, and/or EUV radiation). However, the principles of the present disclosure apply equally to e-beam resists and other direct-write resist materials. In the depicted embodiment, the resist layer 208B includes an EUV-sensitive resist material and the resist solution 208A is a EUV resist solution. For purposes of clarity, the following description discusses the spin coating process for forming the resist layer 208B in separate processing steps (depicted and discussed with respect to FIGS. 3A-3D and FIGS. 4A-4D, respectively) in order to delineate changes imparting on the resist solution 208A as the spin coating process progresses.

As depicted in FIGS. 3A and 3B, the resist solution 208A is dispensed and subsequently dispersed by the spin coating system 300 that includes a chuck 302 on which the underlying structure 210 is secured and at least one nozzle 308 through which the resist solution 208A is supplied to the secured underlying structure 210. In some embodiments, the nozzle 308 dispenses the resist solution 208A to a substantially central location of the underlying structure 210; though the present disclosure is not limited to this configuration. In the depicted embodiment, the spin coating system 300 further includes a moveable armature 310, which allows the nozzle 308 to be positioned anywhere over the underlying structure 210, such as at a substantially central location of the underlying structure 210, for dispensing the resist solution 208A.

Referring to FIG. 3C, the resist solution 208A as it is initially dispensed onto the top surface of the underlying structure 210 has a thickness 242. Referring to FIG. 3D, which is a schematic representation of a composition of the resist solution 208A, the resist solution 208A includes at least a resist polymer 252, a photosensitive unit 254, a photosensitive unit 256, a solvent component 258, and a solvent component 260. The solvent component 258 and the solvent component 260 are included in the resist solution 208A to facilitate the dispensing and the dispersing (as depicted in FIGS. 3A-3D and 4A-4D, respectively) of the resist solution 208A. In many embodiments, the photosensitive unit 254 and the photosensitive unit 256 are blended with the polymer 252, which is dissolved in the solvent component 258 and the solvent component 260. In many embodiments, the photosensitive unit 254 and the photosensitive unit 256 are functional groups bonded to the polymer 252, which is dissolved in the solvent component 258 and the solvent component 260. In the depicted embodiment, components of the resist solution 208A are distributed evenly in the solvent component 258 and the solvent component 260. In other words, interaction between the different solutes of the resist solution 208A (e.g., the polymer 252, the photosensitive unit 254, the photosensitive unit 256, and any other component that is not a solvent) and both of the solvent component 258 and the solvent component 260 is equally favorable such that aggregation is minimal.

In many embodiments, the polymer 252 includes an acrylate-based polymer, a poly(norbornene)-co-maleic anhydride (COMA) polymer, a poly(hydroxystyrene)-based polymer, other suitable polymers, or combinations thereof, and may be bonded to any number of functional groups configured to assist one or more subsequent lithography processes. In some examples, the functional groups may include photosensitive groups (e.g., sensitizers) such as phenol, styrene, fluoride, other suitable groups, or combinations thereof. In some example, the functional groups may include acid-labile groups (ALGs) configured to be cleavable by an acidic moiety (e.g., acid generated by a PAG).

In many embodiments, the photosensitive units 254 and 256 absorb radiation energy during an exposure process, undergo chemical and/or physical reactions upon exposure, and subsequently effect chemical and/or physical changes in the polymer 252. The photosensitive unit 254 is configured to generate an acidic moiety in response to radiation energy, and in many examples may be a PAG. The acidic moiety may then cleave the ALG bonded to the polymer 252, thereby chemically transforming the structure of the polymer 252 for a subsequent development process. In the depicted embodiment, an amount of the photosensitive unit 254 is less than an amount of the polymer 252 and may be, for example, about ⅓ to about ½ the amount of the polymer 252. Non-limiting examples of the photosensitive unit 254 include N-sulfonyloxyimide, benzoinsulfonate, pyrogallol trisulfonate, nitrobenzyl sulfonate, triphenylsulfonium nonaflate, sulfonyldiazomethane-based compounds, sulfone-based compounds, glyoxime-based compounds, derivatives thereof, other compounds, or combination thereof.

In the present disclosure, the photosensitive unit 256 is distinctly different from the photosensitive unit 254 and may include a photo-decomposable quencher (PDQ), a photo-decomposable base (PDB), a photo-base generator (PBG), other photosensitive units, or combinations thereof. The PDQ is configured to reduce concentration of acidic moieties in regions where chemical changes (e.g., changes in solubility) to the polymer 252 are not desired. For example, PDQ may be configured to reduce excessive acidic moieties generated by the PAG (i.e., photosensitive unit 254) in unexposed regions of a positive-tone resist material. PDB, as the name suggests, decomposes basic moieties in response to radiation energy. PBG, on the other hand, produces basic moieties in response to radiation energy. In some embodiments, the PDQ, PDB, PBG have different photo-sensitivities (e.g., respond to radiation of different range of wavelengths) from that of the PAG (e.g., the photosensitive unit 254), though the present disclosure is not limited as such. The resist solution 208A may further include a number of additives such as cross-linking agents (e.g., tetramethylol glycoluril linker or epoxy linker), surfactant, chromophores, and/or solvents.

The solvent component 258 and the solvent component 260 differ in terms of composition. Specifically, the solvent component 258 includes at least one polar solvent having a boiling point of greater than about 180 degrees Celsius. The solvent component 258 may include, for example, diethylene glycol dimethyl ether, triethylene glycol dimethyl ether, dimethyl sulfoxide, ethylene glycol, glycerin, hexamethylphosphoramide, N-methyl-2-pyrrolidinone, benzonitrile, 1,2-dichlorobenzene, N,N dimethylacetamide, 2-ethoxyethyl ether, gamma-butyrolactone, 1,6-di-acetoxyhexane, tri (propylene glycol) methyl ether, propylene carbonate, tetra (ethylene glycol) monomethyl ether, other suitable polar solvents, or combinations thereof.

On the other hand, the solvent component 260 may include a polar or a non-polar solvent having a boiling point of less than about 80% that of the solvent component 258 (for example, less than about 145 degrees Celsius). Since magnitude of a boiling point of a solvent is generally inversely correlated to magnitude of its vapor pressure, the lower boiling point of the solvent component 260 indicates that it has a higher vapor pressure than the solvent component 258. In other words, under similar conditions (e.g., temperature, atmospheric pressure, humidity, etc.), the solvent component 260 will evaporate at a higher rate than the solvent component 258. In many embodiments, the solvent component 260 includes one or more solvents of different compositions. The solvent component 260 may include propylene glycol methyl ether acetate (PGMEA), propylene glycol monomethyl ether (PGME), gamma-butyrolactone, ethyl lactate, cyclohexanone, n-butyl actetate, ethyl ketone, dimethyl formamide, alcohol (e.g., isopropyl alcohol or ethanol), and/or other suitable solvents. In the depicted embodiment, the solvent component 260 includes PGMEA, PGME, or a combination thereof.

Furthermore, the solvent component 258 and the solvent component 260 differ in terms of their respective amount (for example, in a percentage of a total volume, or vol %) included in the resist solution 208A. Because the solvent component 258 includes at least one polar solvent, the amount of the solvent component 258 may be from 0.1% to about 40 vol % of the total volume of the solvent component 258 and the solvent component 260 in order to facilitate the dispersing (by, for example, spin coating) of the resist solution 208A over the underlying structure 210 (discussed in detail below). In other words, the amount of the solvent component 260 is at least about 60 vol % of the total volume of the solvent component 258 and 260. An amount greater than about 40 vol % for the solvent component 258 would result in poor coating of the resist solution 208A due to high surface tension brought about by the polar solvent(s) included in the solvent component 258. Accordingly, in some examples, a ratio of the amount of the solvent component 258 to the amount of the solvent component 260 in the resist solution 208A is no more than about 2:3.

Relative energy difference (RED) is a parameter that may be used to describe the tendency of solutes (e.g., the polymer 252, the photosensitive unit 254, and the photosensitive unit 256) to dissolve in one or more solvents (e.g., the solvent component 258 and the solvent component 260). Generally, an RED of less than 1 indicates that the solutes and the solvents are similar to each other in terms of their molecular characteristics and thus will exhibit good solubility. On the contrary, an RED of greater than 1 indicates that the solutes and the solvents are too dissimilar to exhibit good solubility. In the present disclosure, though different in terms of composition and relative amount, the solvent components 258 and 260 may be selected such that an overall RED of less than 1 for the resist solution 208A may be achieved. In other words, solubility of polymer 252, the photosensitive unit 254, and the photosensitive unit 256 is ensured or maximized by choices of solvent components 258 and 260.

Referring to FIGS. 4A and 4B, following the dispensing of the resist solution 208A over the underlying structure 210, the spin coating system 300 utilizes the rotation of the underlying structure 210 to disperse the resist solution 208A across a top surface of the underlying structure 210, thereby forming the resist layer 208B. In the depicted embodiment, the chuck 302 rotates the underlying structure 210 about an imaginary axis 306 through the central location of the underlying structure 210. A maximum rotational speed of the chuck 302 (and by extension the underlying structure 210) may reach or exceed 3000 rpm. Furthermore, the rotational speed may vary throughout the spin coating process to control the uniform dispersion of the resist solution 208A. Though not depicted herein, the spin coating system 300 may utilize other components such as gas delivery nozzles, heating elements, and apparatus for positioning the nozzles to control the dispersing of the resist solution 208A. In the depicted embodiment, the spin coating process at operation 120 is implemented and maintained at ambient temperature (e.g., at about 23 degrees Celsius) in order to avoid the over-drying of the resist solution 208A before the resist layer 208B is formed to a uniform thickness.

Notably, referring to FIGS. 4C and 4D, as the spin coating system 300 disperses the resist solution 208A, due to the difference in vapor pressure (i.e., boiling point) between the solvent components 258 and 260, the solvent component 260 evaporates at a significantly higher rate than the solvent component 258. In some examples, at least about 90% of the amount of the solvent component 260 is evaporated during the dispersing of the resist solution 208A while the amount of the solvent component 258 remains substantially the same. In other words, a remaining portion of the solvent component 258 is greater than a remaining portion of the solvent component 260. The amount of the evaporation of the solvent component 260 may be directly correlated to the boiling point of the solvent component 260. For example, a lower boiling point of the solvent component 260 indicates a greater amount of evaporation during the dispersing process. As a result, a thickness 244 of the resist layer 208B is less than the thickness 242 of the resist solution 208A as it was initially deposited over the top surface of the underlying structure 210. Furthermore, because the amount of the solvent component 258 remains substantially the same in the resist layer 208B as in the resist solution 208A, and because the solvent component 258 is selected to achieve favorable interaction (i.e., and RED of less than 1) with the polymer 252, the photosensitive unit 254, and the photosensitive unit 256, aggregation of the polymer 252, the photosensitive unit 254, and the photosensitive unit 256 is minimized even upon the evaporation of the solvent component 260. On the contrary, if the resist solution 208A only includes the solvent component 260 but not the solvent component 258, the evaporation of the solvent component 260 during the spin coating process would significantly reduce the total volume and increase the viscosity of the resist solution 208A, leading to aggregation and non-uniform distribution of the resist layer 208B over the top surface of the underlying structure 210. Accordingly, the solvent component 258 that remains during the spin coating process may facilitate the continuous dispersing of the resist solution 208A to form the resist layer 208B.

Referring to FIGS. 1, 5A, and 5B, the method 100 performs a pre-exposure bake (alternatively referred to as a pre-exposure heat treatment) 230 to the resist layer 208B at operation 130, resulting in a baked resist layer 208C having a thickness 246 that is less than the thickness 244. The pre-exposure bake 230 may be implemented at a temperature lower than the boiling point of the solvent component 258 but higher than the boiling point of the solvent component 260. In some examples, the pre-exposure bake 230 may be implemented at a temperature of about 90 degrees Celsius to about 150 degrees Celsius. The temperature of the pre-exposure bake 230 may be tuned such that the method 100 completely removes the remainder of the solvent component 260 without completely removing the solvent component 258. A portion of the solvent component 258 remaining in the resist layer 208C may be advantageous as it may assist in the diffusion of photosensitive units 254 and 256 across the top surface of the underlying structure 210 to ensure that the subsequent exposure and development processes are implemented efficiently. In some embodiments, the temperature of the pre-exposure bake 230 may be adjusted depending upon the extent of diffusion desired for the photosensitive units 254 and 256. For example, for a longer diffusion length, the temperature may be reduced accordingly. If the pre-exposure bake 230 is implemented at a temperature less than about 90 degrees Celsius, the solvent component 260 may not be completely removed, leading to unstable resist layer 208B (e.g., having a non-uniform thickness) as the remaining solvent component 260 gradually evaporates. On the other hand, if the pre-exposure bake 230 is implemented at a temperature greater than about 150 degrees Celsius, excess thermal stress may cause the resist layer 208B to decompose.

Thereafter, referring to FIGS. 1 and 6, the method 100 exposes the resist layer 208C to radiation 216 at operation 140. In many embodiments, the radiation 216 may be an Mine (wavelength approximately 365 nm), DUV radiation such as KrF excimer laser (wavelength approximately 248 nm) or ArF excimer laser (wavelength approximately 193 nm), EUV radiation (wavelength between about 1 nm and about 100 nm), an x-ray, an e-beam, an ion beam, and/or other suitable radiations. The exposure process at operation 140 may be performed in air, in a liquid (immersion lithography), or in vacuum (e.g., for EUV lithography and e-beam lithography). In the depicted embodiment, the exposure process at operation 140 is implemented using a photomask 218. The photomask 218 may be a transmissive mask or a reflective mask, each of which may further implement resolution enhancement techniques such as phase-shifting (e.g., an alternative phase-shift mask, an attenuated phase-shift mask, or a chromeless phase-shift mask), off-axis illumination (OAI) and/or optical proximity correction (OPC). In alternative embodiments, the radiation 216 is directly modulated with a predefined pattern, such as an IC layout, without using the photomask 218 (such as using an e-beam direct writer). In the depicted embodiment, the radiation 216 is EUV radiation and the exposure process at operation 140 is performed in a EUV lithography system. Correspondingly, the photomask 218 may be a reflective photomask used to pattern the resist layer 208C.

Subsequently, the exposure process at operation 140 forms a latent pattern on the resist layer 208C which includes exposed regions 212 and unexposed regions 214. The latent pattern generally refers to a pattern exposed on the resist layer, which eventually becomes a physical resist pattern when the resist layer is subjected to a developing process. The resist layer 208C in the exposed regions 212 undergo a series of photochemical reactions, while the resist layer 208C in the unexposed regions 214 remains substantially the same as the resist material prior to being exposed.

Referring to FIGS. 1 and 7, the method 100 at operation 150 performs a post-exposure bake (alternatively referred to as a post-exposure heat treatment) 250 to the exposed resist layer 208C, which now includes the exposed regions 212 and the unexposed regions 214. The post-exposure bake 250 may be configured to catalyze the photochemical reactions of the photosensitive unit 254 and/or the photosensitive unit 256 initiated by the exposure process at operation 140. The post-exposure bake 250 may be implemented at a temperature lower than the boiling point of the solvent component 258 but similar to, lower than, or greater than the boiling point of the solvent component 260. In some embodiments, depending upon the specific solvent chosen as the solvent components 258 and 260, the post-exposure bake 250 may be implemented at a temperature lower than or similar to the pre-exposure bake 230, such as from about 90 degrees Celsius to about 130 degrees Celsius; though the present disclosure is not limiting in this aspect. If the temperature is lower than about 90 degrees Celsius, components (e.g., ALG) responsible for achieve CAR reactions may not be activated. On the other hand, if the temperature is greater than about 130 degrees Celsius, the diffusion length of the photosensitive unit 254 may be too long, which may adversely affect the quality of the resist layer 208C.

Referring to FIGS. 1, 8A, and 8B, the method 100 implements a developing process to the resist layer 208C at operation 160, thereby forming a pattern in the resist layer 208C. The developing process implements a developer to dissolve or otherwise remove either the unexposed regions 214 (FIG. 8A) or the exposed regions 212 (FIG. 8B) depending upon molecular interaction between the developer and the resist layer, which will be discussed in detail below. The developing process may be implemented by spraying the developer on the resist layer 208C by a spin-coating process similar to the spin coating process described above. In some examples, a developer 222 may be used to remove the unexposed regions 214 during a negative-tone development process (FIG. 8A), or alternatively, a developer 224 may be used to remove the exposed regions 212 during a positive-tone development process (FIG. 8B). In the depicted embodiment, the developer 222 is a non-polar solvent, which includes molecules having zero net dipole moment, while the developer 224 is a polar solvent, which includes molecules have a non-zero net dipole moment. In many embodiments, the developer 222 includes an organic solvent, such as n-butyl acetate, ethanol, hexane, benzene, toluene, and/or other suitable solvents, while the developer 224 includes an aqueous solvent, such as tetramethyl ammonium hydroxide (TMAH), KOH, NaOH, and/or other suitable solvents.

Referring to FIG. 1, the method 100 performs additional fabrication processes at operation 170 that include, for example, transferring the pattern formed in the resist layer 208C to the middle layer 206 and the bottom layer 204 in one or more etching processes and subsequently removing the resist layer 208C, the middle layer 206, and the bottom layer 204 following each etching process. The etching processes may be implemented by any suitable method including a dry etching process, a wet etching process, other suitable etching process, a reactive ion etching (RIE) process, and/or other suitable processes. In some embodiments, the resist layer 208C is removed by any suitable method, such as resist stripping or plasma ashing. In one example, the resist layer 208C may be removed by a stripping solution that includes a solvent similar to the solvent component 258. Subsequently, the substrate 202 may be processed using the patterned bottom layer 204 as a mask. Any suitable method may be performed to process the substrate 202 including a deposition process, an implantation process, an epitaxial growth process, other fabrication process, or combinations thereof.

Thereafter, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Various advantages may be present in one or more embodiments of the methods, devices, and compositions described herein. For example, the present disclosure provides methods of improving the coating of a resist solution over a substrate by controlling evaporation of solvents included in the resist solution. Specifically, embodiments in the present disclosure are directed to methods of tuning evaporation of the resist solution, which include various photosensitive units and polymer configured to form a CAR resist material, during a spin coating process by including at least two solvent components having dissimilar vapor pressure (i.e., boiling points) and at different amounts. During the spin coating process, the solvent component having a lower vapor pressure (thus higher boiling point) remains over the substrate, while the solvent component having a higher vapor pressure (thus lower boiling point) evaporates. The solvent component that remains during the spin coating process may prevent various components of the resist solution from aggregating and assist the dispersing of the resist solution across the substrate.

In one aspect, the present disclosure provides a method that includes providing a photoresist solution, dispersing the photoresist solution over a substrate to form a film, baking the film, exposing the film, and developing the exposed film. In some embodiments, the photoresist solution includes a first solvent having a first volume and a second solvent having a second volume, where the first solvent is different from the second solvent, and where the first volume is less than the second volume. In some embodiments, the dispersing evaporates a portion of the first solvent and a portion of the second solvent such that a remaining portion of the first solvent is greater than a remaining portion of the second solvent;

In some embodiments, the first solvent includes diethylene glycol dimethyl ether, triethylene glycol dimethyl ether, dimethyl sulfoxide, ethylene glycol, glycerin, hexamethylphosphoramide, N-methyl-2-pyrrolidinone, benzonitrile, 1,2-dichlorobenzene, N,N dimethylacetamide, 2-ethoxyethyl ether, gamma-butyrolactone, 1,6-di-acetoxyhexane, tri(propylene glycol) methyl ether, propylene carbonate, tetra (ethylene glycol) monomethyl ether, or combinations thereof. In further embodiments, the second solvent includes propylene glycol methyl ether, propylene glycol monomethy ether acetate, or combinations thereof.

In some embodiments, the photoresist solution further includes a polymer, a photoacid generator (PAG), and a quencher. In further embodiments, a relative energy difference between the first solvent and each of the polymer, the PAG, and the quencher is less than 1.

In some embodiments, the exposing of the film includes applying an extreme ultraviolet (EUV) source.

In some embodiments, where the baking of the film is implemented in a first baking process at a first temperature, the method further includes baking the film in a second baking process at a second temperature after the exposing of the film, the first temperature and the second temperature being less than a boiling point of the first solvent. In further embodiments, the second temperature is lower than the first temperature.

In another aspect, the present disclosure provides a method that includes dispersing a resist layer on a substrate, performing a first heat treatment to the resist layer, exposing the resist layer to extreme ultraviolet (EUV) radiation, performing a second heat treatment to the exposed resist layer, and developing the exposed resist layer to form a patterned resist layer. In some embodiments, the resist layer includes a photosensitive unit, a first solvent having a first boiling point, and a second solvent having a second boiling point, where the first boiling point is less than the second boiling point. In some embodiments, the first heat treatment is performed at a first temperature, where the first temperature is greater than the first boiling point but lower than the second boiling point. In some embodiments, the second heat treatment is performed at a second temperature that is less than the second boiling point. In some embodiments, the method further includes processing the substrate using the patterned resist layer as a mask, and removing the patterned resist layer, where the removing includes applying a resist stripping solution, and where the resist stripping solution includes the second solvent.

In some embodiments, the resist layer has a first thickness after the dispersing of the resist layer and before the performing of the first heat treatment, and the resist layer has a second thickness after the performing of the first heat treatment and before the exposing of the resist layer, where the second thickness is less than the first thickness.

In some embodiments, after the dispersing of the resist layer, an amount of the second solvent is greater than an amount of the first solvent.

In some embodiments, the second solvent includes 1, 6-di-acetoxyhexane, tri(propylene glycol) methyl ether, propylene carbonate, triethylene glycol dimethyl ether, tetra (ethylene glycol) monomethyl ether, or combinations thereof. In further embodiments, the first solvent includes propylene glycol methyl ether, propylene glycol monomethy ether acetate, or combinations thereof.

In yet another aspect, the present disclosure provides a method that includes providing an extreme ultraviolet (EUV) resist solution, spin-coating the EUV resist solution over a substrate to form an EUV resist layer, performing a pre-exposure bake to the EUV resist layer, exposing the EUV resist layer to form an exposed EUV resist layer, performing a post-exposure bake to the exposed EUV resist layer, and developing the exposed EUV resist layer. In some embodiments, the EUV resist solution includes a first solvent and a second solvent, an amount of the first solvent being greater than an amount of the second solvent. In some embodiments, the spin-coating evaporates a portion of the first solvent and a portion of the second solvent such that a remaining amount of the second solvent is greater than a remaining amount of the first solvent, In some embodiments, the first solvent having a first vapor pressure and the second solvent having a second vapor pressure, wherein the second vapor pressure is lower than the first vapor pressure.

In some embodiments, a ratio of the amount of the second solvent to the amount of the first solvent before the spin-coating of the EUV resist layer is no more than about 2:3.

In some embodiments, the second solvent includes diethylene glycol dimethyl ether, hexamethylphosphoramide, N-methyl-2-pyrrolidinone, benzonitrile, 1,2-dichlorobenzene, N,N dimethylacetamide, 2-ethoxyethyl ether, gamma-butyrolactone, or combinations thereof.

In some embodiments, the performing of the pre-exposure bake evaporates the first solvent completely without evaporating the second solvent completely.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a photoresist solution, wherein the photoresist solution includes a first solvent having a first volume and a second solvent having a second volume, wherein the first solvent and the second solvent differ in composition, and wherein the first volume is less than the second volume;
   dispersing the photoresist solution over a substrate to form a film, wherein the dispersing evaporates a portion of the first solvent and a portion of the second solvent such that a remaining portion of the first solvent is greater than a remaining portion of the second solvent;
   baking the film;
   after baking the film, exposing the film, resulting in an exposed film; and
   developing the exposed film.

2. The method of claim 1, wherein the first solvent includes diethylene glycol dimethyl ether, triethylene glycol dimethyl ether, dimethyl sulfoxide, ethylene glycol, glycerin, hexamethylphosphoramide, N-methyl-2-pyrrolidinone, benzonitrile, 1,2-dichlorobenzene, N,N dimethylacetamide, 2-ethoxyethyl ether, gamma-butyrolactone, 1,6-di-acetoxy-hexane, tri(propylene glycol) methyl ether, propylene carbonate, tetra(ethylene glycol) monomethyl ether, or combinations thereof.

3. The method of claim 2, wherein the second solvent includes propylene glycol methyl ether, propylene glycol monomethyl ether acetate, or combinations thereof.

4. The method of claim 1, wherein the photoresist solution further includes a polymer, a photoacid generator (PAG), and a quencher.

5. The method of claim 4, wherein a relative energy difference between the first solvent and each of the polymer, the PAG, and the quencher is less than 1.

6. The method of claim 1, wherein the exposing of the film includes applying an extreme ultraviolet (EUV) source.

7. The method of claim 1, wherein the baking of the film is implemented in a first baking process at a first temperature, further comprising baking the film in a second baking process at a second temperature after the exposing of the film, the first temperature and the second temperature being less than a boiling point of the first solvent.

8. The method of claim 7, wherein the second temperature is lower than the first temperature.

9. A method, comprising:
   dispersing a resist layer on a substrate, wherein the resist layer includes a photosensitive unit, a first solvent having a first boiling point, and a second solvent having a second boiling point, the first boiling point being less than the second boiling point;
   after dispersing the resist layer, performing a first heat treatment to the resist layer, wherein the first heat treatment is performed at a first temperature, and wherein the first temperature is greater than the first boiling point but lower than the second boiling point;
   after performing the first heat treatment, exposing the resist layer to extreme ultraviolet (EUV) radiation;
   performing a second heat treatment to the exposed resist layer, wherein the second heat treatment is performed at a second temperature; and
   developing the exposed resist layer to form a patterned resist layer.

10. The method of claim 9, the resist layer having a first thickness after the dispersing of the resist layer and before the performing of the first heat treatment, and the resist layer having a second thickness after the performing of the first heat treatment and before the exposing of the resist layer, wherein the second thickness is less than the first thickness.

11. The method of claim 9, wherein the second temperature is less than the second boiling point.

12. The method of claim 9, wherein after the dispersing of the resist layer, an amount of the second solvent is greater than an amount of the first solvent.

13. The method of claim 9, wherein the second solvent includes 1, 6-di-acetoxyhexane, tri(propylene glycol) methyl ether, propylene carbonate, triethylene glycol dimethyl ether, tetra(ethylene glycol) monomethyl ether, or combinations thereof.

14. The method of claim 13, wherein the first solvent includes propylene glycol methyl ether, propylene glycol monomethyl ether acetate, or combinations thereof.

15. The method of claim 9, further comprising:
    processing the substrate using the patterned resist layer as a mask; and
    removing the patterned resist layer, wherein the removing includes applying a resist stripping solution, the resist stripping solution including the second solvent.

16. A method, comprising:
    providing an extreme ultraviolet (EUV) resist solution, wherein the EUV resist solution includes a first solvent and a second solvent, an amount of the first solvent being greater than an amount of the second solvent;
    spin-coating the EUV resist solution over a substrate to form an EUV resist layer, wherein the spin-coating evaporates a portion of the first solvent and a portion of the second solvent such that a remaining amount of the second solvent is greater than a remaining amount of the first solvent;
    performing a pre-exposure bake to the EUV resist layer;
    after performing a pre-exposure bake to the EUV resist layer, exposing the EUV resist layer, resulting in an exposed EUV resist layer;
    performing a post-exposure bake to the exposed EUV resist layer; and
    after performing the post-exposure bake, developing the exposed EUV resist layer.

17. The method of claim 16, the first solvent having a first vapor pressure and the second solvent having a second vapor pressure, wherein the second vapor pressure is lower than the first vapor pressure.

18. The method of claim 16, wherein a ratio of the amount of the second solvent to the amount of the first solvent before the spin-coating of the EUV resist layer is no more than about 2:3.

19. The method of claim 16, wherein the second solvent includes diethylene glycol dimethyl ether, hexamethylphosphoramide, N-methyl-2-pyrrolidinone, benzonitrile, 1,2-dichlorobenzene, N,N dimethylacetamide, 2-ethoxyethyl ether, gamma-butyrolactone, or combinations thereof.

20. The method of claim 16, wherein the performing of the pre-exposure bake evaporates the first solvent completely without evaporating the second solvent completely.

* * * * *